United States Patent
Farhat et al.

(10) Patent No.: US 11,395,446 B2
(45) Date of Patent: Jul. 19, 2022

(54) ELECTROMAGNETICALLY SHIELDING MATERIAL

(71) Applicant: Glenair, Inc., Glendale, CA (US)

(72) Inventors: Samer J. Farhat, Oak Park, CA (US); Guido Hunziker, Altadena, CA (US); John N. Nguyen, Moorpark, CA (US); Stephen D. Board, Glendale, CA (US)

(73) Assignee: GLENAIR, INC., Glendale, CA (US)

(*) Notice: Subject to any disclaimer, the term of this patent is extended or adjusted under 35 U.S.C. 154(b) by 348 days.

(21) Appl. No.: 16/379,801

(22) Filed: Apr. 10, 2019

(65) Prior Publication Data

US 2020/0329594 A1    Oct. 15, 2020

(51) Int. Cl.
| | |
|---|---|
| *H01B 11/06* | (2006.01) |
| *H05K 9/00* | (2006.01) |
| *D02G 3/12* | (2006.01) |
| *D02G 3/44* | (2006.01) |
| *H01B 13/22* | (2006.01) |
| *H01B 7/17* | (2006.01) |
| *H01B 7/00* | (2006.01) |
| *H01B 11/10* | (2006.01) |

(52) U.S. Cl.
CPC ............ *H05K 9/0088* (2013.01); *D02G 3/12* (2013.01); *D02G 3/441* (2013.01); *H01B 7/0009* (2013.01); *H01B 7/17* (2013.01); *H01B 11/1033* (2013.01); *H01B 13/22* (2013.01)

(58) Field of Classification Search
CPC .............................. H01B 7/0009; H01B 11/06
See application file for complete search history.

(56) References Cited

U.S. PATENT DOCUMENTS

| | | | |
|---|---|---|---|
| 1,727,550 A | 10/1926 | Legg | |
| 4,537,808 A * | 8/1985 | Yamamoto | B32B 15/01 267/86 |
| 4,868,565 A * | 9/1989 | Mettes | H01B 11/1033 340/854.9 |
| 5,012,045 A | 4/1991 | Sato | |

(Continued)

OTHER PUBLICATIONS

Glenair; Braided Wire Protection; Jan. 2017.
(Continued)

*Primary Examiner* — Chau N Nguyen
(74) *Attorney, Agent, or Firm* — David S. Alavi (57) ABSTRACT

An electromagnetic shielding material includes multiple strands of an electrically conductive yarn that are arranged as a braided, knitted, or woven mesh. Each strand of the electrically conductive yarn comprises one or more electrically conductive filaments; each electrically conductive filament comprises a core of a first electrically conductive material surrounded by a sheath of a second electrically conductive material different from the first electrically conductive material. The first electrically conductive material exceeds the second electrically conductive material with respect to electrical conductivity, while the second electrically conductive material exceeds the first electrically conductive material with respect to one or more of tensile strength, corrosion resistance, or one or more other mechanical or chemical properties or characteristics. In many examples, the first electrically conductive material includes copper and the second electrically conductive material includes stainless steel.

31 Claims, 1 Drawing Sheet

(56) References Cited

U.S. PATENT DOCUMENTS

| | | | |
|---|---|---|---|
| 5,118,905 A * | 6/1992 | Harada | H01B 11/1813 |
| | | | 156/47 |
| 5,468,557 A | 11/1995 | Nishio et al. | |
| 6,316,723 B1 | 11/2001 | Woehl et al. | |
| 6,710,253 B2 | 3/2004 | Wildschut | |
| 7,029,289 B2 | 4/2006 | Li | |
| 7,291,391 B2 | 11/2007 | Watson et al. | |
| 7,700,215 B2 | 4/2010 | Haltiner et al. | |
| 7,923,390 B2 | 4/2011 | Burke et al. | |
| 9,751,148 B2 | 9/2017 | Sharrow | |
| 10,499,550 B2 * | 12/2019 | Hongo | D06M 11/83 |
| 2007/0199730 A1 * | 8/2007 | Fazakas | H01B 7/30 |
| | | | 174/102 R |
| 2013/0233594 A1 * | 9/2013 | Lee | H01L 24/43 |
| | | | 174/126.2 |
| 2014/0251651 A1 * | 9/2014 | Huang | A61B 8/44 |
| | | | 174/34 |

OTHER PUBLICATIONS

ASTM International; Standard Practice for Operating Salt Spray (Fog) Apparatus; B117 Rev 16 (2016).
Philippe, L. et al; Electroplating of Stainless Steel; Chemistry of Materials vol. 20 pp. 3377-3384 (2008).

* cited by examiner

ELECTROMAGNETICALLY SHIELDING MATERIAL

FIELD OF THE INVENTION

The field of the present invention relates to electromagnetically shielding material. In particular, braided, woven, or knitted mesh material is disclosed wherein electrically conductive filaments include core and sheath materials, the core exceeds the sheath with respect to electrical conductivity, and the sheath exceeds the core with respect to one or more of tensile strength, corrosion resistance, or one or more other mechanical or chemical properties or characteristics.

BACKGROUND

Cables that carry electrical signals typically comprise one or more inner electrical conductors surrounded by an outer electromagnetic shield. The electromagnetic shield can be employed to reduce or eliminate the influence of exterior electromagnetic fields on the inner electrical conductors. In that way environmental noise and stray signals from other sources (e.g., another nearby cable), also known as electromagnetic interference or EMI, can be excluded from, or at least reduced in, the signals carried by the inner electrical conductors of the cable. If multiple inner electrical conductors are present in a single cable, the outer electromagnetic shield typically encircles all of them; if needed or desired additional electromagnetic shielding can be employed surround each inner conductor, or around pairs of inner conductors, within the outer shielding. Such additional shielding around individual or paired inner conductors can be employed to reduce or eliminate electromagnetic interference between the inner conductors within a single cable (also known as crosstalk).

In some instances, the outer electromagnetic shield can include electrically conductive foil wrapped around the one or more inner electrical conductors of the cable (or around paired or individual inner conductors within the cable). In some instances, an electromagnetic shielding material can be employed that comprises multiple strands of conductive yarn arranged as a braided, woven, or knitted mesh; braided shields are quite common. Such material can be formed as a flexible sheet that is wrapped around the inner conductors, formed as a flexible tube into which the inner conductors are inserted, or braided, woven, or knitted around the inner conductors to form a tubular layer around the inner conductors. In some examples a foil shield and a braided, woven, or knitted shield can be employed together, usually with the foil shield within the braided, woven, or knitted shield. The electrically conductive yarn can comprise a single electrically conductive filament (i.e., so-called metal monofilament yarn) that includes one or more suitably conductive metals such as copper, aluminum, stainless steel, and so forth. Alternatively, each strand of the electrically conductive yarn can comprise multiple electrically conductive filaments; such filaments can be either twisted together or bundled together without twisting.

In some conventional braided, woven, or knitted electromagnetic shielding materials, the conductive filaments are formed from a single metal; copper is often employed, but other suitably conductive metals could be employed instead. In other conventional braided, woven, or knitted materials, one or more suitably conductive metals form a coating or sheath around a core comprising one or more materials different from the coating or sheath material(s). Core material(s) can provide strength or other desirable mechanical properties, and the one or more coating or sheath metals provide electrical conductivity and can also provide corrosion resistance or other desirable mechanical or chemical properties. Core material(s) can, but need not, include one or more metals, thereby also providing electrical conductivity. Common examples of multi-material filament include filaments in which a layer of tin, nickel, or silver is formed on a core of copper, or in which a layer of copper, tin, nickel, or silver is formed on a core of stainless steel or aluminum or on a core of Zylon®, Kevlar®, or other suitable polymer. Core materials that are stronger or more robust enable use of thinner filaments to form the mesh, resulting in a thinner and lighter mesh without compromising shielding effectiveness. In some examples multiple metal sheath layers are employed, e.g., a tin or nickel layer on a copper layer on a stainless steel core. In some examples the one or more metal sheath layers are electroplated or electrodeposited onto the core material to form the multi-material filament (referred to hereinafter as a plated filament); in other examples a larger-diameter wire, made up of a metallic core surrounded by a metallic sheath, is drawn through one or more dies to form the thinner multi-material filament (referred to hereinafter as a drawn filament).

SUMMARY

An electromagnetic shielding material comprises multiple strands of an electrically conductive yarn that are arranged as a braided, knitted, or woven mesh. Each strand of the electrically conductive yarn comprises one or more electrically conductive filaments; each electrically conductive filament comprises a core of a first electrically conductive material surrounded by a sheath of a second electrically conductive material different from the first electrically conductive material. The first electrically conductive material exceeds the second electrically conductive material with respect to electrical conductivity, while the second electrically conductive material exceeds the first electrically conductive material with respect to one or more of tensile strength, corrosion resistance, or one or more other mechanical or chemical properties or characteristics. In many examples, the first electrically conductive material includes copper and the second electrically conductive material includes stainless steel. The electromagnetically shielding material can be used to form outer electromagnetic shield of an electrical cable that include one or more inner electrical conductors. The electromagnetically shielding material can be formed as a flexible tube or a flexible sheet, or can be braided, woven, or knitted around one or more inner electrical conductors of an electrical cable to form a tubular layer around the one or more inner electrical conductors.

Objects and advantages pertaining to electromagnetically shielding materials may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. The embodiments shown are only examples and should not be construed as limiting the scope of the present disclosure or appended claims.

DETAILED DESCRIPTION OF EMBODIMENTS

It would be desirable in some instances to provide an electrically conductive yarn for forming a braided, woven, or knitted mesh electromagnetically shielding material in which the filaments that make up the yarn strands include a core and an outer layer (i.e., sheath or cladding) surrounding the core, wherein the outer layer is more mechanically or chemically robust than the core and the core is more electrically conductive than the outer layer. Such a shielding material can exhibit one or more of improved transfer impedance, improved shielding attenuation, improved pull strength, improved corrosion resistance, improved abrasion resistance, improved flex life, or other improved property or characteristic, relative to conventional braided, woven, or knitted mesh electromagnetically shielding material (including those described hereinabove).

Figures 1, 2, 3:
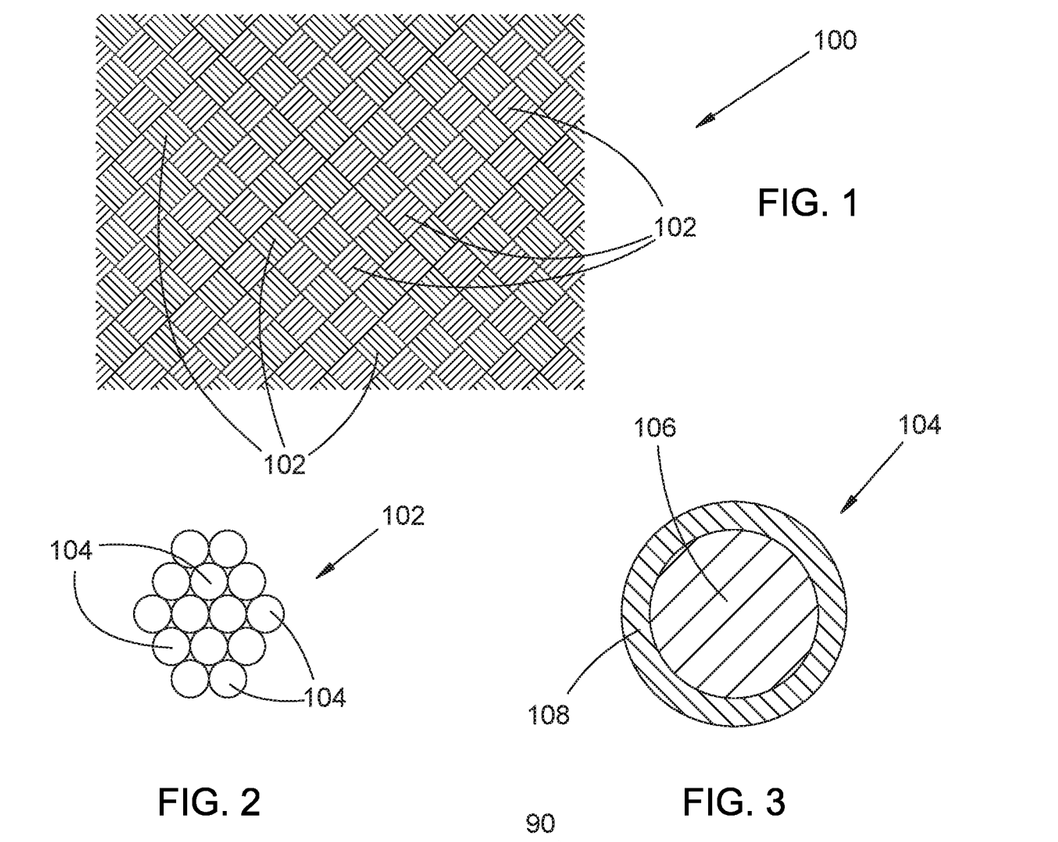
FIG. 1 illustrates schematically multiple strands of electrically conductive yarn forming an electromagnetically shielding mesh.
FIG. 2 illustrates schematically multiple electrically conductive filaments forming a strand of electrically conductive yarn.
FIG. 3 illustrates schematically an electrically conductive filament formed by an electrically conductive core within an electrically conductive sheath of a material different from that of the core.

Accordingly, an inventive electromagnetic shielding material 100 comprises multiple strands 102 of an electrically conductive yarn that are arranged as a braided, knitted, or woven mesh (e.g., as in FIG. 1). Each strand 102 of the electrically conductive yarn comprises one or more electrically conductive filaments 104 (e.g., as in FIG. 2). Each electrically conductive filament 104 comprises a core 106 of a first electrically conductive material surrounded by a sheath 108 of a second electrically conductive material different from the first electrically conductive material (e.g., as in FIG. 3). Such electrically conductive filaments 104 can be referred to hereinafter as clad filaments or sheathed filaments. The first electrically conductive material (core material) exceeds the second electrically conductive material (sheath material) with respect to electrical conductivity; the second electrically conductive material exceeds the first electrically conductive material with respect to one or more of tensile strength, corrosion resistance, or other one or more mechanical or chemical properties or characteristics (e.g., temperature resistance, desirable surface chemistry such as oxide formation, hardness, elastic modulus, elongation before breakage, surface tension, solderability, or thermal emissivity). In this context "exceeds" does not necessarily mean "is greater than" but instead means "imparts more desirable properties or characteristics onto the shielding mesh than"; in some examples (e.g., electrical conductivity, tensile strength, or corrosion resistance) those two definitions coincide, while in other examples those two definitions might not coincide.

In various preferred examples of an inventive electromagnetic shielding material 100 each electrically conductive filament 104 includes a copper core 106 (e.g., 99.9% pure oxygen-free copper) surrounded by a stainless steel sheath 108 (e.g., 316 stainless steel). The corrosion resistance of the electromagnetically shielding material 100 incorporating such copper-within-stainless-steel filaments 104 can significantly exceed the corrosion resistance of conventional shielding materials made with stainless-steel-within-copper filaments.

In various examples of inventive electromagnetically shielding material 100 the first electrically conductive material of the core 106 can include one or more of copper, silver, gold, aluminum, gallium, bismuth, suitable alloys or mixtures of any two or more of those materials, or conductive ceramic materials including super-conducting materials. In various examples of inventive electromagnetically shielding material 100 the second electrically conductive material can include one or more of stainless steel (any suitable alloy), titanium, iridium, tungsten, niobium, molybdenum, tantalum, nickel, vanadium, palladium, platinum, rhodium, ruthenium, osmium, or suitable alloys or mixtures of any two or more of those materials.

Electrical conductivity is expressed herein as a percentage of the International Annealed Copper standard (IACS; 100% IACS is equivalent to electrical resistivity of $1.7 \times 10^{-8} \Omega \cdot m$ at 20° C.). In various examples of the inventive electromagnetic shielding material 100, the electrical conductivity of the first electrically conductive material (core 106) is more than about 2 times greater, more than about 5 times greater, more than about 10 times greater, more than about 25 times greater, more than about 40 times greater, more than about 50 times greater, or more than about 100 times greater than the electrical conductivity of the second electrically conductive material (sheath 108); in various preferred examples the electrical conductivity of the copper core 106 is about 100.% IACS and the electrical conductivity of the stainless steel sheath 108 is between 2% and 3% IACS (typically about 2.3% IACS). In various examples of the inventive electromagnetic shielding material 100, the tensile strength of the second electrically conductive material (sheath 108) is more than about two times greater, more than about five times greater, or more than about ten times greater than the tensile strength of the first electrically conductive material (core 106); in various preferred examples the tensile strength of the stainless steel of the sheath 108 is about 620 MPa and the tensile strength of the copper of the core 106 is about 210 MPa. In various examples of the inventive electromagnetic shielding material 100, the corrosion resistance (e.g., as measured by the salt fog test administered according to DO-160G Section 14 Category T or according to the ASTM B117 standard; both of those are incorporated by reference as if fully set forth herein) of the second electrically conductive material (sheath 108) is more than about two times greater, more than about five times greater, or more than about ten times greater than the corrosion resistance of the first electrically conductive material (core 106).

In many examples of the inventive electromagnetic shielding material 100, each electrically conductive sheathed filament 104 comprises drawn core 106 and sheath 108. Such drawn, sheathed filaments 104 are made by drawing thicker wire or stock material having core material surrounded by sheath material through a die, or more typically through a series of progressively smaller dies, to form the drawn, sheathed filament 104. To form various preferred examples, thicker copper wire or stock material within a thicker stainless steel sheath can be drawn to form the sheathed filaments 104 with the copper core 106 and stainless steel sheath 108. In some of those examples the drawn, sheathed filaments 104 are used to form the strands 102 of the electrically conductive yarn without annealing or other further processing. In other of those examples, the drawn, sheathed filaments 104 can be annealed (using any suitable annealing process) before forming the strands 102 of the electrically conductive yarn.

In other examples of the inventive electromagnetic shielding material 100, the sheath 108 of each electrically conductive filament 104 comprises sheath material electroplated or electrodeposited on the core 106. Any suitable electroplating or electrodeposition process can be employed. Various preferred examples can be formed by electroplating stainless steel sheath material onto a copper filament core, e.g., according to the process of Philippe et al (*Chemistry of Materials*; Vol 20 pp 3377-3384 (2008)).

In various examples of an inventive electromagnetic shielding material 100, each electrically conductive filament 104 can be less than about 200. microns in diameter, less than about 100. microns in diameter, less than about 50. microns in diameter, or less than about 20. microns in diameter. In various examples of an inventive electromagnetic shielding material 100, each electrically conductive sheath 108 is less than about 20. microns thick, less than about 10 microns thick, less than about 8 microns thick, less than about 6.0 microns thick, or less than about 4.0 microns thick. In one of the preferred examples, each electrically conductive filament 104 is about 48. microns in diameter with a stainless steel sheath 108 between about 6 microns thick and about 8 microns thick surrounding a copper core 106.

In some examples of an inventive electromagnetic shielding material 100, each strand 102 of the electrically conductive yarn can include only one electrically conductive filament 104. In other examples of an inventive electromagnetic shielding material 100, each strand 102 of the electrically conductive yarn can include multiple electrically conductive filaments 104 bundled together without twisting. In still other examples of an inventive electromagnetic shielding material 100, each strand 102 of the electrically conductive yarn can include multiple electrically conductive filaments 104 twisted together. Multiple filaments 104 bundled together without twisting can in some instances lie flatter when incorporated into a mesh; twisting multiple filaments 104 can in some instances serve to balance tension among the multiple filaments while forming the mesh. In twisted examples, each strand 102 of the conductive yarn has less than about 2 twists per inch, less than about one twist per inch, or less than about half a twist per inch. In various of the multiple-filament-per-strand examples (twisted or non-twisted), each strand 102 of the electrically conductive yarn can include from 2 to 100 electrically conductive filaments 104, from 5 to 50 electrically conductive filaments 104, or from 10 to 25 electrically conductive filaments 104. In one preferred example, 14 electrically conducting filaments 104 are twisted at about three-eighths (⅜) of a twist per inch to form each strand 102 of the electrically conductive yarn.

Figure 4:
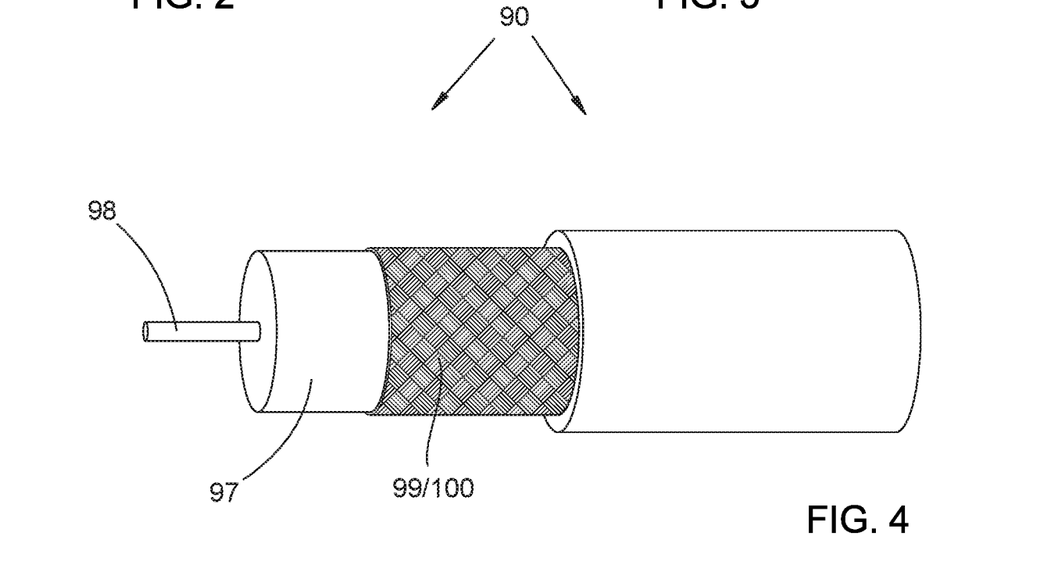
FIG. 4 illustrates schematically an electrical cable with an electromagnetically shielding mesh forming an electromagnetic shield around an inner conductor of the cable.

To form the inventive electromagnetically shielding material 100, multiple strands 102 of the electrically conducting yarn can be braided, woven, or knitted to form a mesh. In some examples the mesh can be arranged as a flexible tube; in other examples the mesh can be arranged as a flexible sheet. A common use of the inventive electrically shielding material 100 is for forming at least a portion of an electromagnetic shield 99 of an electrical cable 90 (e.g., as in FIG. 4). The cable 90 comprises any suitable number of one or more inner electrical conductors 98 within the electromagnetic shield 99 (only one inner conductor 98 in the example shown), typically insulated from one another and from the shield 99 (e.g., by insulator 97 in the example shown). In some examples, a sheet of the electromagnetically shielding material 100 can be wrapped around the inner conductor(s) 98 to form the electromagnetic shield 99 of the cable 90. In other examples, the inner conductor(s) 98 can be inserted into a tube formed from the electromagnetic shielding material 100 so that the tube forms the electromagnetic shield 99 of the cable 90. In still other examples, the multiple strands 102 of the electrically conductive yarn can be braided, woven, or knitted around the inner electrical conductors(s) 98 to form a tubular layer of the electromagnetically shielding material 100 around the inner conductor(s) 98, thus forming the electromagnetic shield 99 of the cable 90.

Various examples of an inventive electromagnetic shielding material 100, including various preferred examples (i.e., including filaments 104 with copper cores 106 surrounded by stainless steel sheaths 108), when braided to form a flexible tubular electromagnetic shield, exhibit transfer impedance that can be less than about 100. mΩ/m, less than about 50. mΩ/m, less than about 40. mΩ/m, or less than about 30. mΩ/m, for electrical signal frequencies up to 100 MHz. Various braided, tubular examples can exhibit screening attenuation greater than about 30. dB, greater than about 40. dB, or greater than about 50. dB, for electrical signal frequencies above 500 MHz. Such good shielding performance is somewhat surprising given that the well-known skin effect would lead one to expect shielding performance to be limited or degraded by the skin effect forcing current into the lower-conductivity sheath 108 of each filament 104. At least for the various preferred examples disclosed herein (copper within stainless steel), no such limitation or degradation is observed, leading to the unexpectedly good shield performance at high frequencies (e.g., above 500 MHz).

Various examples of an inventive electromagnetic shielding material 100, including various preferred examples (i.e., including filaments 104 with copper cores 106 surrounded by stainless steel sheaths 108), when braided to form a flexible tubular electromagnetic shield, exhibit pull strength greater than about 100. pounds, greater than about 150. pounds, or greater than about 200. pounds. Various examples of an inventive electromagnetic shielding material 100, including various preferred examples (i.e., including filaments 104 with copper cores 106 surrounded by stainless steel sheaths 108), when braided to form a flexible tubular electromagnetic shield, continue to exhibit electrical resistance less than about 50. mΩ/m, less than about 30. mΩ/m, or less than about 20. mΩ/m after more than 48 hours or exposure, more than 96 hours of exposure, or more than 1000 hours of exposure to an aqueous NaCl mist (during a salt fog test administered according to DO-160G Section 14 Category T or according to the ASTM B117 standard).

Various examples of an inventive electromagnetic shielding material 100, including various preferred examples (i.e., including filaments 104 with copper cores 106 surrounded by stainless steel sheaths 108), when braided to form a flexible tubular electromagnetic shield, continue to exhibit electrical resistance less than about 50. mΩ/m, less than about 30. mΩ/m, or less than about 20. mΩ/m after more than 10,000 bending cycles or more than 25,000 bending cycles (each bending cycle being bending from 0° to 180° and back again around a 2.5 inch diameter mandrel). Various examples of an inventive electromagnetic shielding material 100, including various preferred examples (i.e., including filaments 104 with copper cores 106 surrounded by stainless steel sheaths 108), when braided to form a flexible tubular electromagnetic shield, continue to exhibit electrical resistance less than about 50. mΩ/m, less than about 30. mΩ/m, or less than about 20. mΩ/m after ten or more temperature cycles (each temperature cycle being 30 minutes at 200° C., cooling from 200° C. to −65° C. in less than 1 minute, 30 minutes at −65° C., and heating from −65° C. to 200° C. in less than 1 minute). Various examples of an inventive electromagnetic shielding material 100, including various preferred examples (i.e., including filaments 104 with copper cores 106 surrounded by stainless steel sheaths 108), when braided to form a flexible tubular electromagnetic shield, continue to exhibit electrical resistance less than about 50. mΩ/m, less than about 30. mΩ/m, or less than about 20. mΩ/m after more than 1000 abrasion cycles or more than 5000 abrasion cycles (each abrasion cycle being about 0.25 inches of reciprocating movement of the tubular shield pressed with a force of about 2.5 pounds against a sacrificial wire bundle).

One preferred example of an inventive electromagnetically shielding material 100 was subjected to a variety of tests and characterizations. The example tested included electrically conductive filaments 104 about 48. microns in diameter with copper cores 106 within a 6-8 micron thick stainless steel sheath 108 surrounding each copper core 106; fourteen of those filaments 104 were twisted at about three-eighths of a turn per inch to form strand 102 of electrically conductive yarn, which was braided into a flexible tubular electromagnetic shield. That tested example exhibited at least 40 dB of screening attenuation for frequencies greater than 500 MHz, transfer impedance less than about 40. mΩ/m for frequencies up to about 80 MHz, pull strength greater than about 200. pounds, electrical resistance less than about 21. mΩ/m after 1008 hours exposed to the salt fog test, electrical resistance less than about 20. mΩ/m after 25,000 bending cycles, electrical resistance less than about 21. mΩ/m after 10 temperature cycles, and electrical resistance less than about 21. mΩ/m after 5000 abrasion cycles.

In addition to the preceding, the following examples fall within the scope of the present disclosure or appended claims:

Example 1

An electromagnetic shielding material comprising multiple strands of an electrically conductive yarn that are arranged as a braided, knitted, or woven mesh, wherein: (a) each strand of the electrically conductive yarn comprises one or more electrically conductive filaments; (b) each electrically conductive filament comprises a core of a first electrically conductive material surrounded by a sheath of a second electrically conductive material different from the first electrically conductive material; (c) the first electrically conductive material exceeds the second electrically conductive material with respect to electrical conductivity; and (d) the second electrically conductive material exceeds the first electrically conductive material with respect to one or both of tensile strength or corrosion resistance.

Example 2

The electromagnetic shielding material of Example 1 wherein (e) the electrical conductivity of the first electrically conductive material is more than about 2 times greater, more than about 5 times greater, more than about 10 times greater, more than about 25 times greater, more than about 40 times greater, more than about 50 times greater, or more than about 100 times greater than the electrical conductivity of the second electrically conductive material, and wherein one or both: (f) the tensile strength of the second electrically conductive material is more than about two times greater, more than about five times greater, or more than about ten times greater than the tensile strength of the first electrically conductive material; or (g) the corrosion resistance of the second electrically conductive material is more than about two times greater, more than about five times greater, or more than about ten times greater than the corrosion resistance of the first electrically conductive material.

Example 3

The electromagnetic shielding material of Example 1 wherein (e) the electrical conductivity of the first electrically conductive material is more than about ten times greater than the electrical conductivity of the second electrically conductive material, and (f) the corrosion resistance of the second electrically conductive material is more than about two times greater than the corrosion resistance of the first electrically conductive material.

Example 4

The electromagnetic shielding material of any one of Examples 1 through 3 wherein the first electrically conductive material includes one or more of copper, silver, gold, aluminum, gallium, bismuth, suitable alloys or mixtures of any two or more of those materials, or conductive or super-conductive ceramic materials and the second electrically conductive material includes one or more of stainless steel, titanium, iridium, tungsten, niobium, molybdenum, tantalum, nickel, vanadium, palladium, platinum, rhodium, ruthenium, osmium, or suitable alloys or mixtures of any two or more of those materials.

Example 5

The electromagnetic shielding material of any one of Examples 1 through 4 wherein the first electrically conductive material includes copper and the second electrically conductive material includes stainless steel.

Example 6

An electromagnetic shielding material comprising multiple strands of an electrically conductive yarn that are arranged as a braided, knitted, or woven mesh, wherein: (a) each strand of the electrically conductive yarn comprises one or more electrically conductive filaments; and (b) each electrically conductive filament comprises a core that includes copper surrounded by a sheath that includes stainless steel.

Example 7

The electromagnetic shielding material of any one of Examples 1 through 6 wherein each electrically conductive filament comprises drawn core and sheath.

Example 8

The electromagnetic shielding material of Example 7 wherein the drawn core and sheath are annealed.

Example 9

The electromagnetic shielding material of any one of Examples 1 through 6 wherein the sheath of each electrically conductive filament comprises material electroplated or electrodeposited on the core.

Example 10

The electromagnetic shielding material of any one of Examples 1 through 9 wherein each electrically conductive filament is less than about 200. microns in diameter, less than about 100. microns in diameter, less than about 50. microns in diameter, or less than about 20. microns in diameter.

Example 11

The electromagnetic shielding material of any one of Examples 1 through 10 wherein each electrically conductive sheath is less than about 20. microns thick, less than about 10. microns thick, less than about 8 microns thick, less than about 6.0 microns thick, or less than about 4.0 microns thick.

Example 12

The electromagnetic shielding material of any one of Examples 1 through 11 wherein each strand of the electrically conductive yarn comprises only one electrically conductive filament.

Example 13

The electromagnetic shielding material of any one of Examples 1 through 11 wherein each strand of the electrically conductive yarn comprises multiple electrically conductive filaments bundled together without twisting.

Example 14

The electromagnetic shielding material of any one of Examples 1 through 11 wherein each strand of the electrically conductive yarn comprises multiple electrically conductive filaments twisted together.

Example 15

The electromagnetic shielding material of Example 14 wherein each strand of the conductive yarn has less than about 2 twists per inch, less than about one twist per inch, or less than about half a twist per inch.

Example 16 electromagnetic shielding material of any one of Examples 13 through 15 wherein each strand of the electrically conductive yarn includes from 2 to 100 electrically conductive filaments, from 5 to 50 electrically conductive filaments, or from 10 to 25 electrically conductive filaments.

Example 17

The electromagnetic shielding material of any one of Examples 1 through 16 wherein the braided, woven, or knitted mesh is arranged as a flexible tube.

Example 18

The electromagnetic shielding material of Example 17 wherein the flexible tube exhibits a transfer impedance less than about 100. mΩ/m, less than about 50. mΩ/m, less than about 40. mΩ/m, or less than about 30. mΩ/m for electrical signal frequencies up to 100 MHz.

Example 19

The electromagnetic shielding material of any one of Examples 17 or 18 wherein the flexible tube exhibits screening attenuation greater than about 30 dB, greater than about 40 dB, or greater than about 50 dB for electrical signal frequencies above 500 MHz.

Example 20

The electromagnetic shielding material of any one of Examples 17 through 19 wherein the flexible tube exhibits pull strength greater than about 100. pounds, greater than about 150. pounds, or greater than about 200. pounds.

Example 21

The electromagnetic shielding material of any one of Examples 17 through 20 wherein, after 48 or more hours, after 96 or more hours, or after 1000 or more hours of exposure to an aqueous NaCl mist during a salt fog test administered according to DO-160G Section 14 Category T or according to ASTM B117 standard, the flexible tube exhibits electrical resistance less than about 50. mΩ/m, less than about 30. mΩ/m, or less than about 20. mΩ/m.

Example 22

The electromagnetic shielding material of any one of Examples 17 through 21 wherein, after 10,000 or more cycles or after 25,000 or more cycles of bending from 0° to 180° and back again around a 2.5 inch diameter mandrel, the flexible tube exhibits electrical resistance less than about 50. mΩ/m, less than about 30. mΩ/m, or less than about 20. mΩ/m.

Example 23

The electromagnetic shielding material of any one of Examples 17 through 22 wherein the flexible tube exhibits electrical resistance less than about 50. mΩ/m, less than about 30. mΩ/m, or less than about 20. mΩ/m after ten or more temperature cycles wherein each cycle includes 30 minutes at 200° C., cooling from 200° C. to −65° C. in less than 1 minute, 30 minutes at −65° C., and heating from −65° C. to 200° C. in less than 1 minute.

Example 24

The electromagnetic shielding material of any one of Examples 17 through 23 wherein the flexible tube exhibits electrical resistance less than about 50. mΩ/m, less than about 30. mΩ/m, or less than about 20. mΩ/m after 1000 or more abrasion cycles or after 5000 or more abrasion cycles wherein each cycle includes about 0.25 inches of reciprocating movement of the flexible tube pressed with a force of about 2.5 pounds against a sacrificial wire bundle.

Example 25

The electromagnetic shielding material of any one of Examples 1 through 16 wherein the braided, woven, or knitted mesh is arranged as a flexible sheet.

Example 26

An electrical cable comprising an outer electromagnetic shield and one or more inner electrical conductors within the electromagnetic shield, wherein the outer electromagnetic shield includes the electromagnetic shielding material of any one of Examples 1 through 25.

Example 27

A method for making the electrical cable of Example 26 comprising braiding, weaving, or knitting the multiple strands of the electrically conductive yarn around the one or more inner electrical conductors to form a tubular layer of the electromagnetic shielding material around the one or more inner electrical conductors to form the electrical cable.

Example 28

A method for making the electrical cable of Example 26 wherein: (a) the braided, woven, or knitted mesh is arranged as a flexible tube; and (b) the method comprises inserting the one or more inner electrical conductors into the flexible tube to form the electrical cable.

Example 29

A method for making the electrical cable of Example 26 wherein: (a) the braided, woven, or knitted mesh is arranged as a flexible sheet; and (b) the method comprises wrapping the flexible sheet around the inner electrical conductors to form the electrical cable.

Example 30

A method for making the electromagnetic shielding material of any one of Examples 1 through 25, the method comprising braiding, weaving, or knitting the multiple strands of the electrically conductive yarn to form a braided, woven, or knitted mesh.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the scope of the appended claims can, but does not necessarily, encompass the whole of the subject matter disclosed in the present application.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open-ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An electromagnetic shielding material comprising multiple strands of an electrically conductive yarn that are arranged as a braided, knitted, or woven mesh, wherein:
   (a) each strand of the electrically conductive yarn comprises one or more electrically conductive filaments;
   (b) each electrically conductive filament comprises a core of a first electrically conductive material surrounded by a sheath of a second electrically conductive material different from the first electrically conductive material;
   (c) the first electrically conductive material exceeds the second electrically conductive material with respect to electrical conductivity;
   (d) the second electrically conductive material exceeds the first electrically conductive material with respect to one or both of tensile strength or corrosion resistance;
   (e) the braided, woven, or knitted mesh is arranged as a flexible tube; and
   (f) the flexible tube exhibits screening attenuation greater than about 30 dB for electrical signal frequencies above 500 MHz.

2. The electromagnetic shielding material of claim 1 wherein (g) the electrical conductivity of the first electrically conductive material is more than about ten times greater than the electrical conductivity of the second electrically conductive material, and wherein one or both:
   (h) the tensile strength of the second electrically conductive material is more than about two times greater than the tensile strength of the first electrically conductive material; or
   (i) the corrosion resistance of the second electrically conductive material is more than about two times greater than the corrosion resistance of the first electrically conductive material.

3. The electromagnetic shielding material of claim 1 wherein (g) the electrical conductivity of the first electrically conductive material is more than about ten times greater than the electrical conductivity of the second electrically conductive material, and (h) the corrosion resistance of the second electrically conductive material is more than about two times greater than the corrosion resistance of the first electrically conductive material.

4. The electromagnetic shielding material of claim 1 wherein the first electrically conductive material includes one or more of copper, silver, gold, aluminum, gallium, bismuth, suitable alloys or mixtures of any two or more of those materials, or conductive or super-conductive ceramic materials and the second electrically conductive material includes one or more of stainless steel, titanium, iridium, tungsten, niobium, molybdenum, tantalum, nickel, vanadium, palladium, platinum, rhodium, ruthenium, osmium, or suitable alloys or mixtures of any two or more of those materials.

5. The electromagnetic shielding material of claim 1 wherein the first electrically conductive material includes copper and the second electrically conductive material includes stainless steel.

6. An electromagnetic shielding material comprising multiple strands of an electrically conductive yarn that are arranged as a braided, knitted, or woven mesh, wherein:
   (a) each strand of the electrically conductive yarn comprises one or more electrically conductive filaments;
   (b) each electrically conductive filament comprises a core that includes copper surrounded by a sheath that includes stainless steel;
   (c) the braided, woven, or knitted mesh is arranged as a flexible tube; and
   (d) the flexible tube exhibits screening attenuation greater than about 30 dB for electrical signal frequencies above 500 MHz.

7. The electromagnetic shielding material of claim 6 wherein each electrically conductive filament comprises drawn core and sheath.

8. The electromagnetic shielding material of claim 7 wherein the drawn core and sheath are annealed.

9. The electromagnetic shielding material of claim 6 wherein the sheath of each electrically conductive filament comprises material electroplated or electrodeposited on the core.

10. The electromagnetic shielding material of claim 6 wherein each electrically conductive filament is less than about 100. microns in diameter.

11. The electromagnetic shielding material of claim 6 wherein each electrically conductive filament is less than about 50. microns in diameter.

12. The electromagnetic shielding material of claim 6 wherein each electrically conductive sheath is less than about 10. microns thick.

13. The electromagnetic shielding material of claim 6 wherein each electrically conductive sheath is less than about 8 microns thick.

14. The electromagnetic shielding material of claim 6 wherein each strand of the electrically conductive yarn comprises only one electrically conductive filament.

15. The electromagnetic shielding material of claim 6 wherein each strand of the electrically conductive yarn comprises multiple electrically conductive filaments bundled together without twisting.

16. The electromagnetic shielding material of claim 6 wherein each strand of the electrically conductive yarn comprises multiple electrically conductive filaments twisted together.

17. The electromagnetic shielding material of claim 6 wherein each strand of the electrically conductive yarn includes from 2 to 100 electrically conductive filaments.

18. The electromagnetic shielding material of claim 6 wherein each strand of the electrically conductive yarn includes from 10 to 25 electrically conductive filaments.

19. The electromagnetic shielding material of claim 6 wherein the flexible tube exhibits a transfer impedance less than about 100. mΩ/m for electrical signal frequencies up to 100 MHz.

20. The electromagnetic shielding material of claim 6 wherein the flexible tube exhibits screening attenuation greater than about 40 dB for electrical signal frequencies above 500 MHz.

21. The electromagnetic shielding material of claim 6 wherein the flexible tube exhibits pull strength greater than about 100. pounds.

22. The electromagnetic shielding material of claim 6 wherein, after 96 or more hours of exposure to an aqueous NaCl mist during a salt fog test administered according to DO-160G Section 14 Category T or according to ASTM B117 standard, the flexible tube exhibits electrical resistance less than about 50. mΩ/m.

23. The electromagnetic shielding material of claim 6 wherein, after 1000 or more hours of exposure to an aqueous NaCl mist during a salt fog test administered according to DO-160G Section 14 Category T or according to ASTM B117 standard, the flexible tube exhibits electrical resistance less than about 50. mΩ/m.

24. The electromagnetic shielding material of claim 6 wherein, after 10,000 or more cycles of bending from 0° to 180° and again around a 2.5 inch diameter mandrel, the flexible tube exhibits electrical resistance less than about 50. mΩ/m.

25. The electromagnetic shielding material of claim 6 wherein the flexible tube exhibits electrical resistance less than about 50. mΩ/m after ten or more temperature cycles wherein each cycle includes 30 minutes at 200° C., cooling from 200° C. to −65° C. in less than 1 minute, 30 minutes at −65° C., and heating from −65° C. to 200° C. in less than 1 minute.

26. The electromagnetic shielding material of claim 6 wherein the flexible tube exhibits electrical resistance less than about 50. mΩ/m after 1000 or more abrasion cycles wherein each cycle includes about 0.25 inches of reciprocating movement of the flexible tube pressed with a force of about 2.5 pounds against a sacrificial wire bundle.

27. An electrical cable comprising an outer electromagnetic shield and one or more inner electrical conductors within the electromagnetic shield, wherein the outer electromagnetic shield includes the electromagnetic shielding material of claim 6.

28. A method for making the electrical cable of claim 27 comprising braiding, weaving, or knitting the multiple strands of the electrically conductive yarn around the one or more inner electrical conductors to form the flexible tube around the one or more inner electrical conductors to form the electrical cable.

29. A method for making the electrical cable of claim 27 wherein the method comprises inserting the one or more inner electrical conductors into the flexible tube to form the electrical cable.

30. A method for making the electrical cable of claim 27 wherein: (a) the braided, woven, or knitted mesh is arranged as a flexible sheet; and (b) the method comprises wrapping the flexible sheet around the inner electrical conductors to form the flexible tube around the inner electrical conductors to form the electrical cable.

31. A method for making the electromagnetic shielding material of claim 6, the method comprising braiding, weaving, or knitting the multiple strands of the electrically conductive yarn to form a braided, woven, or knitted mesh arranged as the flexible tube.

* * * * *